(12) United States Patent
Hisada et al.

(10) Patent No.: US 6,281,946 B1
(45) Date of Patent: Aug. 28, 2001

(54) TELEVISION RECEIVER

(75) Inventors: Osamu Hisada, Kanagawa; Genichiro Kuboji, Chiba, both of (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 08/952,077
(22) PCT Filed: Mar. 31, 1997
(86) PCT No.: PCT/JP97/01108
  § 371 Date: Oct. 18, 1997
  § 102(e) Date: Oct. 18, 1997
(87) PCT Pub. No.: WO97/38525
  PCT Pub. Date: Oct. 16, 1997

(30) Foreign Application Priority Data

Apr. 4, 1996 (JP) .................................................. 8-082660

(51) Int. Cl.[7] .............................. H04N 5/44; H04N 5/21; H04N 5/50; H04N 5/62; H04B 1/06
(52) U.S. Cl. ......................... 348/725; 348/725; 348/735; 348/737; 348/607; 455/266; 455/260; 455/307; 455/264
(58) Field of Search ...................................... 348/735, 737, 348/607, 731; 358/191.1; 455/260, 258, 307, 264, 302, 283, 285, 317, 310, 324, 325, 326, 327, 328, 329, 330, 340, 266; H04N 5/44, 5/455

(56) References Cited

U.S. PATENT DOCUMENTS

| | | | |
|---|---|---|---|
| 3,454,710 | * 7/1969 | Gassmann . | |
| 4,876,739 | * 10/1989 | Ma et al. | 455/266 |
| 4,979,230 | * 12/1990 | Marz | 455/314 |
| 4,989,264 | * 1/1991 | Ohto | 455/266 |
| 5,159,711 | * 10/1992 | Ma et al. | 455/307 |
| 5,263,197 | * 11/1993 | Manjo et al. | 455/324 |
| 5,371,902 | * 12/1994 | Marz | 455/304 |
| 5,644,368 | * 7/1997 | Natsume | 348/737 |
| 5,724,105 | * 3/1998 | Hatano | 348/725 |
| 5,864,373 | * 1/1999 | Hatano | 348/737 |

\* cited by examiner

Primary Examiner—Reinhard J. Eisenzopf
Assistant Examiner—Paulos Natnael
(74) Attorney, Agent, or Firm—Jay H. Maioli

(57) ABSTRACT

In a television receiver having a tuner 2 for converting a received signal from an antenna 1 to an intermediate frequency signal and supplying the intermediate frequency signal to a homodyne detector circuit through a filter device to extract a video signal, a variable frequency oscillator is provided for changing the frequency of the intermediate frequency signal such that the frequency of beat components between a local oscillating signal of the tuner and a harmonic signal of the intermediate frequency signal is coincident with a trap frequency of the filter device. The occurrence of interference due to the intermediate frequency signal introducing into the antenna can be prevented by a simple configuration.

2 Claims, 4 Drawing Sheets

1: Video Frequency Of J-5CH     177.25MHz

2: Audio Frequency Of J-5CH     181.75MHz

3: Waves At Frequency Three Times Higher Than VCO Frequency 58.75MHz     176.25MHz

TELEVISION RECEIVER

TECHNICAL FIELD

The present invention relates to a television receiving apparatus suitable for use, for example, in a portable device. More particularly, the present invention relates to a television receiving apparatus which eliminates the possibility of interference in a received image possibly caused by beat components generated between a harmonic signal of an intermediate frequency signal used therein and a local oscillating signal of a tuner.

BACKGROUND ART

In a portable television receiving apparatus, for example, a television signal is received using an antenna directly coupled to the receiving apparatus, such as a rod antenna or the like. In this event, a harmonic signal of an intermediate frequency signal used within the television receiving apparatus, for example, may be introduced into a tuner through the antenna to possibly cause interference in a received image due to beat components generated between the harmonic signal of the intermediate frequency signal and a local oscillating signal of the tuner.

Conventionally, for such interference, the tuner is provided with a shield case to prevent unnecessary signals from introducing into the tuner from a structural approach. However, such a structural solution may not completely prevent the occurrence of the interference, and additionally incurs a problem of an increase in cost and number of manufacturing steps due to parts including such a shield case etc., an increase in volume and weight of a product, etc.

The present application has been made in view of the problems mentioned above, and has an object to provide a television receiving apparatus which is capable of reliably preventing the occurrence of interference by a simple configuration.

DISCLOSURE OF THE INVENTION

The present invention is intended to make the frequency of beat components between a local oscillating signal of a tuner and a harmonic signal of an intermediate frequency signal coincident with a trap frequency of a filter means by providing a variable frequency oscillating means for changing the frequency of the intermediate frequency signal, and discloses a television receiving apparatus associated therewith.

BEST MODE FOR CARRYING OUT THE INVENTION

A television receiving apparatus according to the present invention will hereinafter be described in detail with reference to the accompanying drawings.

The present invention is intended to reliably prevent the occurrence of interference in a received image due to beat components between a harmonic signal of an intermediate frequency signal and a local oscillating signal of a tuner by a simple configuration.

For this purpose, in the present invention, a television receiving apparatus having a tuner for converting a received signal into an intermediate frequency signal and supplying the intermediate signal to a homodyne detector circuit through a filter means to extract a video signal, is provided with a variable frequency oscillating means for changing the frequency of the intermediate frequency signal such that the frequency of beat components between a local oscillating signal of the tuner and a harmonic signal of the intermediate frequency is coincident with a trap frequency of the filter means.

Thus, a first embodiment of the present invention proposes the following configuration. Specifically, FIG. 1 is a block diagram illustrating the configuration of an embodiment of the television receiving apparatus according to the present invention.

Figure 1:
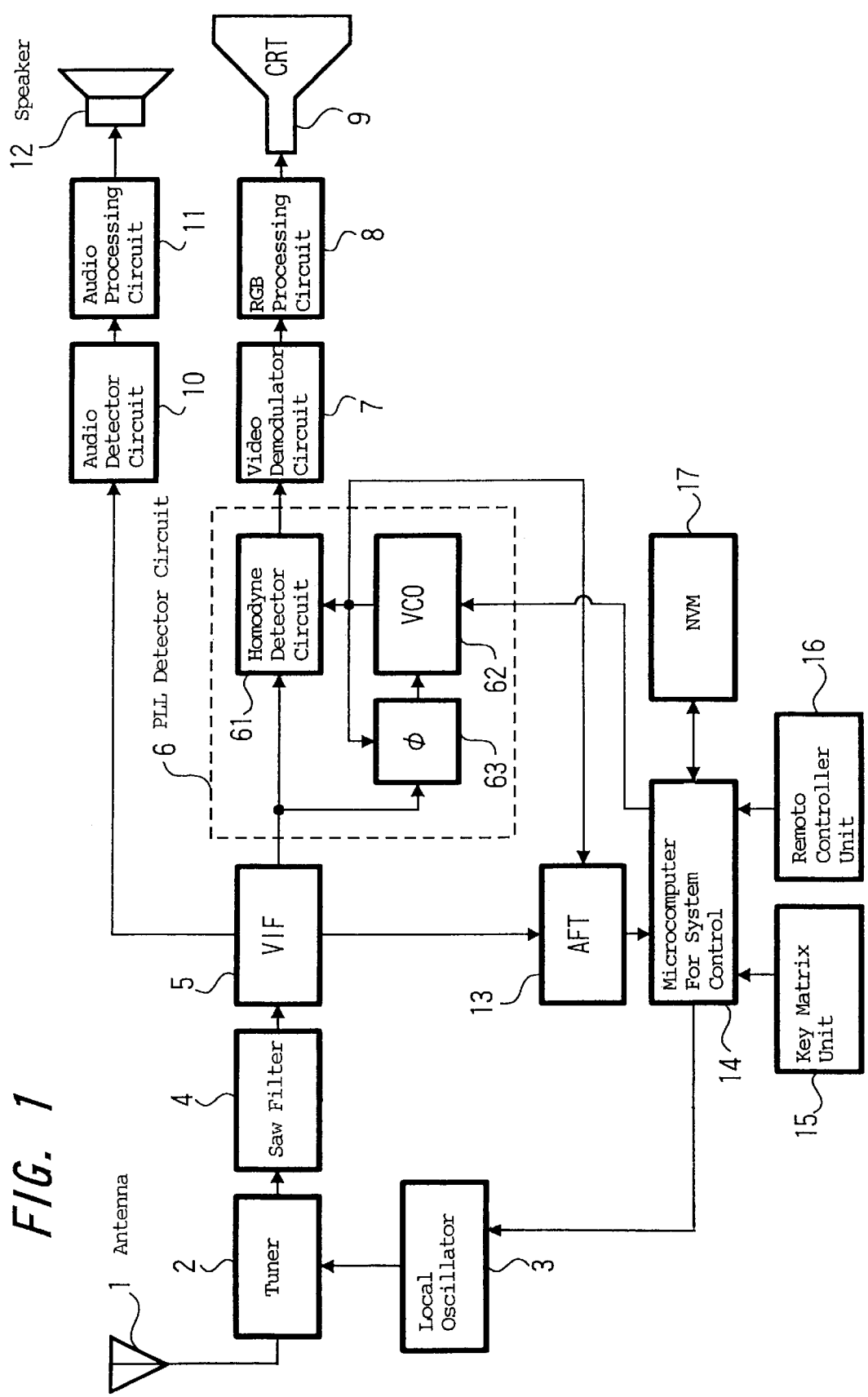
FIG. 1 is a configuration diagram for explaining an example of a television receiving apparatus to which the present invention is applied.

In this FIG. 1, a received signal from an antenna 1 is supplied to a tuner 2. In this tuner 2, the received signal is converted into an intermediate frequency signal by a local oscillating signal from a local oscillator 3, later described. Then, this converted intermediate frequency signal is supplied to an intermediate frequency amplifier (VIF) circuit 5 through a filter means comprising, for example, a surface acoustic wave (SAW) filter 4.

Further, a video intermediate frequency signal from this VIF circuit 5 is supplied to a PLL detector circuit 6, later described, and a signal detected by this PLL detector circuit 6 is supplied to a video demodulator circuit 7 to demodulate a video signal. Then, this demodulated video signal is supplied to a color cathode ray tube (CRT) 9 through an RGB processing circuit 8 to reproduce an image from the received video signal.

Also, an audio intermediate frequency signal from the VIF circuit 5 is supplied to an audio detector circuit 10. Then, an audio signal detected by this audio detector circuit 10 is supplied to a speaker 12 through an audio processing circuit 11 to emanate sound from the received audio signal.

In the above-mentioned PLL detector circuit 6, in turn, the video intermediate frequency signal supplied from the VIF circuit 5 is inputted to a homodyne detector circuit 61. In addition, this homodyne detector circuit 61 is supplied with an oscillating signal (reference frequency signal) from a variable frequency oscillator (VCO) 62 to homodyne-detect the video signal.

At the same time, the oscillating signal from the VCO 62 and the video intermediate frequency signal from the VIF circuit 5 are supplied to a phase detector (φ) 63. Then, a phase difference detecting signal produced by this phase detector 63 is supplied to the VCO 62. In this way, a phase lock loop (PLL) is formed such that the oscillating signal from the VCO 62 is coincident in phase with the video intermediate frequency signal from the VIF circuit 5.

Also, the oscillating signal, (reference frequency signal) from the VCO 62 is supplied to an AFT circuit 13 for maintaining the frequency of the intermediate frequency signal constant. Further, the intermediate frequency signal from the aforementioned VIF circuit 5 is supplied to the AFT circuit 13. Then, in the AFT circuit 13, the frequency of the reference frequency signal from the VCO 62 and the frequency of the intermediate frequency signal from he VIF circuit 5 are respectively converted into voltage values, for example, and a signal indicative of the difference in frequency between the above-mentioned two signals is formed from a difference between these voltage values.

Further, the signal indicative of the difference in frequency between the reference frequency signal and the intermediate frequency signal is supplied to a microcomputer 14 for system control as data for control. Then, a control signal formed in this microcomputer 14 is supplied to the local oscillator 3 of the aforementioned tuner 2. In this way, the oscillating frequency of the local oscillator 3 is controlled such that the frequency of the intermediate frequency signal from the VIF circuit 5 is equal to the frequency of the reference frequency signal from the VCO 62.

The microcomputer 14 is also supplied with a key input signal from a key matrix unit 15 and a remote control signal from a remote control unit 16. Control data and so on formed in the microcomputer 14 are stored in a non-volatile memory (NVM) 17, while the control data etc. stored in this non-volatile memory 17 are read out and then supplied to the microcomputer 14.

Thus, this apparatus detects an input from a user through manipulations on buttons or the like on the key matrix unit 15 and the remote control unit 16. This detected input signal is supplied to the microcomputer 14 to control a channel selection, volume adjustment, image quality adjustment, display on the tube, and so on in accordance with a program previously stored in a ROM (not shown) or the like in the microcomputer 14.

Further, when the input signal indicates a channel selection, a tuning voltage, later described, stored in the non-volatile memory 17 is read out by the microcomputer 14, and this tuning voltage is supplied to the tuner 2 to receive a signal broadcast from a selected channel, and received video signal and audio signal are detected and demodulated in respective circuits at subsequent stages.

In addition, the oscillating frequency of the local oscillator 3 is controlled such that the frequency of a video intermediate frequency signal received by the tuner 2 is coincident with the frequency of the oscillating signal (reference reference frequency signal) from the VCO 62 for homodyne detection, and the AFT circuit 13 performs a control to ensure constantly stable reception.

Then, in this apparatus, the frequency characteristic of the aforementioned SAW filter 4 is, for example, as illustrated by curves in FIG. 2 (curves A, B have the same shape). Specifically, this exemplary characteristic has traps, for example, at 54.25 MHz and 60.25 MHz, to provide a characteristic of a band-pass filter which passes signals at frequencies between these two traps. In this way, the aforementioned received video signal and audio signals, for example, are extracted only from their respective intermediate frequency signal bands, and supplied to the VIC circuit 5.

Figure 3:
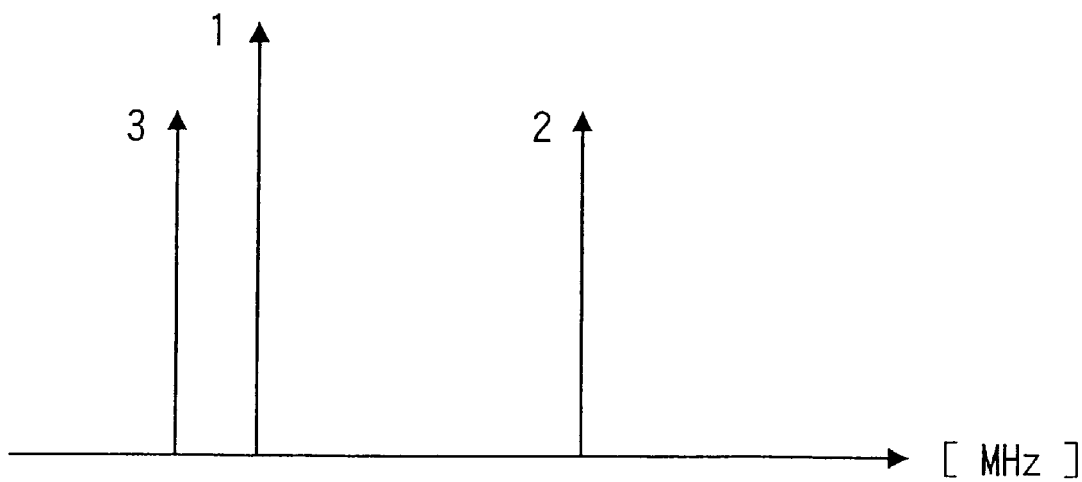
FIG. 3 is a diagram for explaining the operation thereof.

In this apparatus, however, when a frequency at 58.75 MHz is being used for the video intermediate frequency signal, a signal at 176.25 MHz, which is three times higher than the frequency of the video intermediate frequency signal, by way of example, may possibly be introduced into the tuner 2 through the rod antenna. In this event, this signal at 176.25 MHz is merely spaced by 1 MHz from the video signal frequency (177.25 MHz) of Channel 5 in the Japanese channel plan, for example, as illustrated in FIG. 3, so that interference may be caused by this signal in a received image.

More specifically, when 58.75 MHz, for example, is used for the frequency of the video intermediate signal, a video signal at Channel 5 (177.25 MHz) is converted into a video intermediate frequency signal at 58.75 MHz by a local oscillating signal at:

$$177.25 + 58.75 = 236 \text{ MHz}$$

In this event, however, a signal at 176.25 MHz, which is three times higher, is converted into a signal at:

$$176.25 + X = 236 \text{ MHz} \therefore X = 59.75 \text{ MHz}$$

Figure 2A:
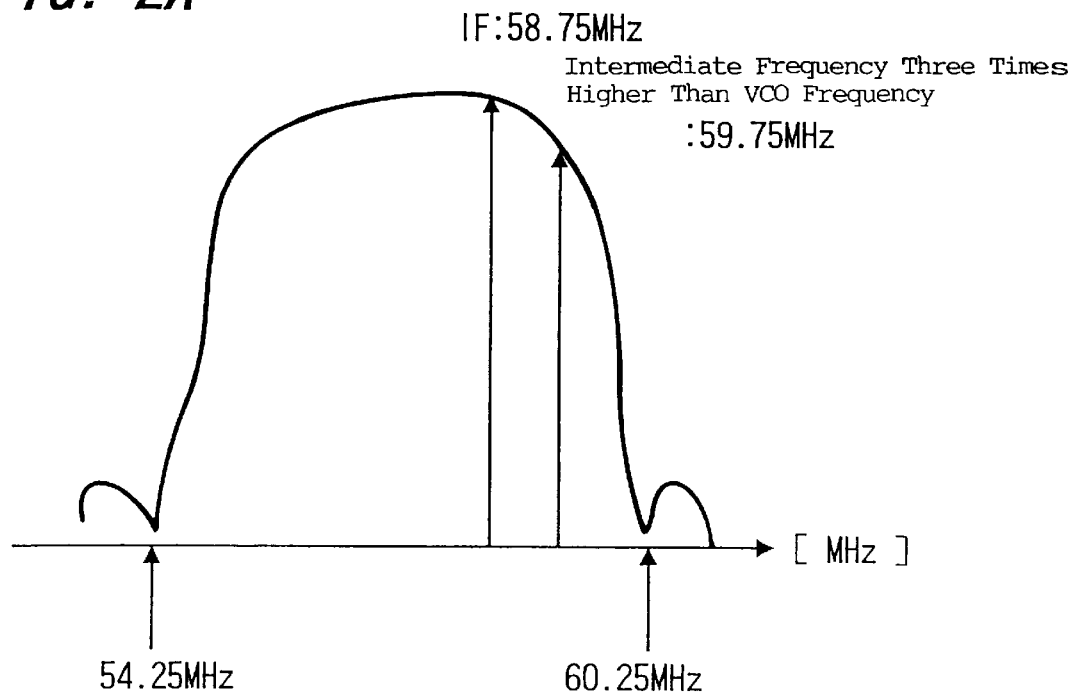
FIG. 2 is a frequency characteristic diagram for explaining the operation thereof.

This signal, which lies within the pass-band of the SAW filter 4 as illustrated in FIG. 2A, is supplied to the VIF circuit 5 through the SAW filter 4, thereby causing interference in a received image.

Thus, in this apparatus, a control is performed to change the frequency of the video intermediate frequency signal to prevent interference from occurring in such a received image when Channel 5, for example is received. More specifically, the frequency of the oscillating signal from the aforementioned VCO 62 is changed from the original 58.75 MHz by +Δf.

On the other hand, assuming that a trap frequency of the aforementioned SAW filter 4 is, for example, 60.25 MHz, the above relational expression is:

$$3 \times (58.75 + \Delta f) + 60.25 = 236 + \Delta f$$

From this, Δf=−0.25 MHz is derived.

In this case, the original video signal is at a frequency of:

$$177.25 + Y = 236 - 0.25 \text{ MHz} \therefore Y = 58.50 \text{ MHz}$$

Figure 2B:
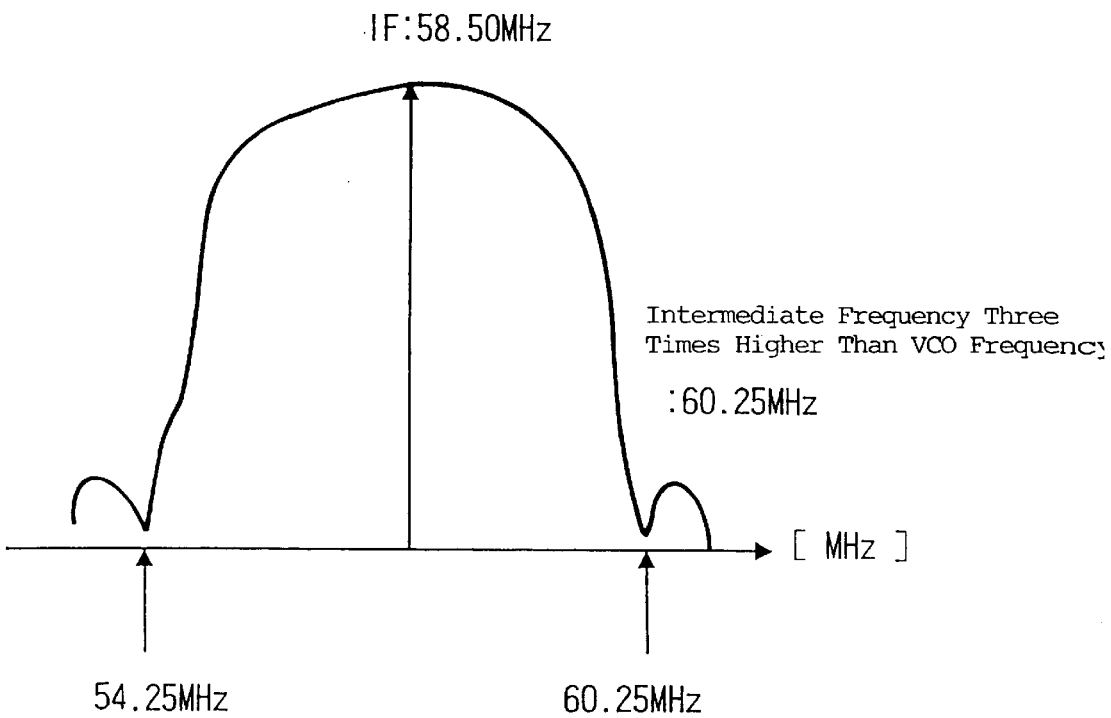

This signal lies within the pass-band of the SAW filter 4 as illustrated in FIG. 2B, so that this signal is supplied to the VIF circuit 5 through the SAW filter 4.

Further, the video intermediate frequency signal at 58.50 MHz from the VIF circuit 5 is homodyne-detected in the PLL detector circuit 6 with an oscillating signal at:

$$58.75 + \Delta f = 58.75 - 0.25 = 58.50 \text{ MHz}$$

from the variable frequency oscillator (VCO) 62, so that the received video signal is detected.

On the other hand, the three-times wave signal of the video intermediate frequency signal has been converted to 60.25 MHz. Then, this signal converted to 60.25 MHz is coincident with the trap frequency of the SAW filter 4, as illustrated in FIG. 2B, and removed, thereby preventing interference from occurring in a received image due to this signal.

In this way, according to this apparatus, the variable frequency oscillating means is provided for changing the frequency of the intermediate frequency signal such that the frequency of beat components between the local oscillating signal of the tuner and a harmonic signal of the intermediate frequency signal is coincident with the trap frequency of the filter means, thereby making it possible to reliably prevent the occurrence of interference in a received image due to the beat components between the harmonic signal of the intermediate frequency signal and the local oscillating signal of the tuner.

Thus, when the apparatus of the present invention as described above is used to perform a frequency conversion on a frequency three times higher than that of a changed video intermediate frequency signal in a manner equivalent to that for converting the frequency of an original video signal to the frequency of this changed video intermediate frequency signal, provided that the converted frequency is coincident with the trap frequency of the aforementioned SAW filter 4, this signal can be removed to prevent the occurrence of interference in a received signal.

In this way, while a conventional structural resolution such as providing a shield case or the like may not produce sufficient effects and incurs problems such as an increase in a cost of parts and so on, the present invention can entirely eliminate these problems.

In the example described above, if the frequency converted from the frequency three times higher than that of the video intermediate frequency signal with the local oscillating signal is coincident with the trap frequency of the SAW filter 4, this signal can be removed. In this case, however, the trap frequency of the SAW filter 4 may vary from a device to another, so that the devices cannot be uniformly controlled with a previously derived value.

Figure 4A:
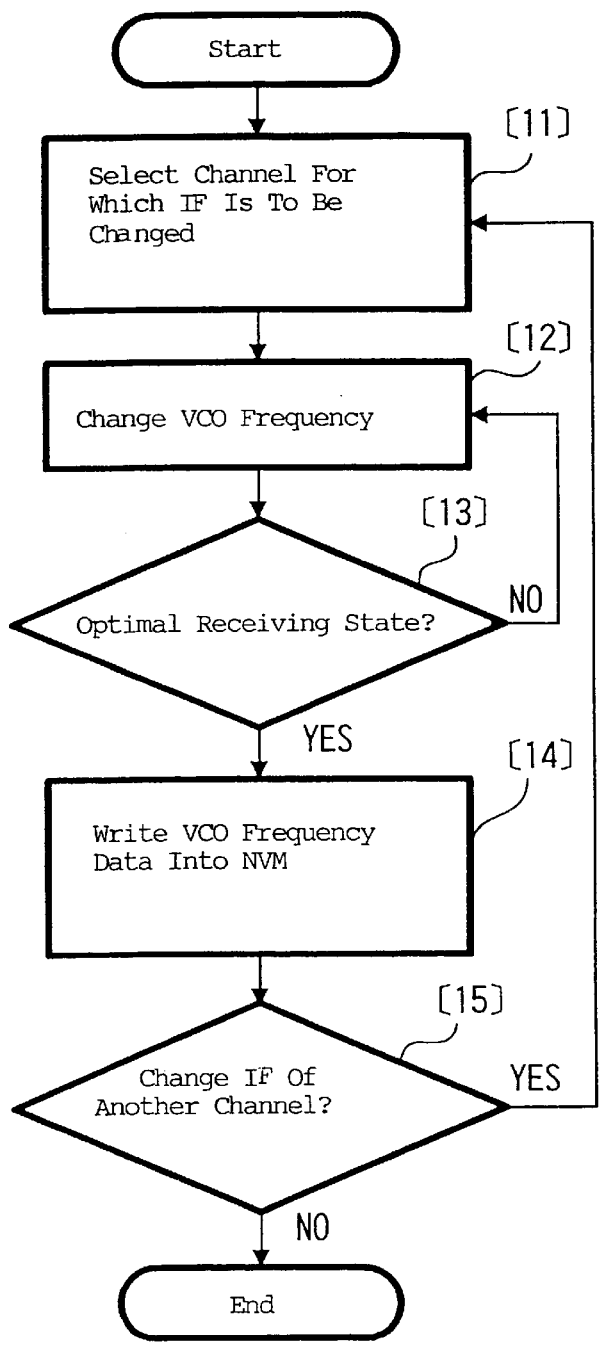
FIG. 4 is a flow chart for explaining the operation thereof.

A flow chart illustrated in FIG. 4A represents an adjustment procedure for determining a necessary frequency (58.75+Δf) of the intermediate frequency signal oscillated by the aforementioned variable frequency oscillator. This adjustment is performed by a service man, for example, on an adjustment line in a product manufacturing factory or during a repair.

Specifically, when the adjustment is started in FIG. 4A, a channel, for which the frequency (IF) of an intermediate frequency signal, is first selected at step [11]. Next, at step [12], the oscillating frequency of the variable frequency oscillator (VCO) 62 is changed. Then, it is determined at step [13] whether or not an optimal receiving state is present. Since a scale pattern or a stripe pattern appears on a received image on the screen when interference is occurring, the occurrence of the interference may be determined by visually recognizing such patterns.

Thus, the steps [12], [13] are repeated until such patterns due to the interference disappear. Then, when the optimal receiving state is determined at step [13], data on the oscillating frequency of the variable frequency oscillator (VCO) 62 at that time is written into the non-volatile memory (NVM) 17. Further, it is determined at step [15] whether or not an IF of another channel is to be changed. If it is changed, the procedure is returned to step [11]. Conversely, if it is not changed, the adjustment is terminated.

In this way, the necessary frequency of the intermediate frequency signal from the variable frequency oscillator (VCO) 62 is determined, and data on the determined frequency is written into the non-volatile memory (NVM) 17. Then, the data written in this non-volatile memory (NVM) 17 is used to perform reception, for example, as illustrated in a flow chart of FIG. 4B.

Figure 4B:
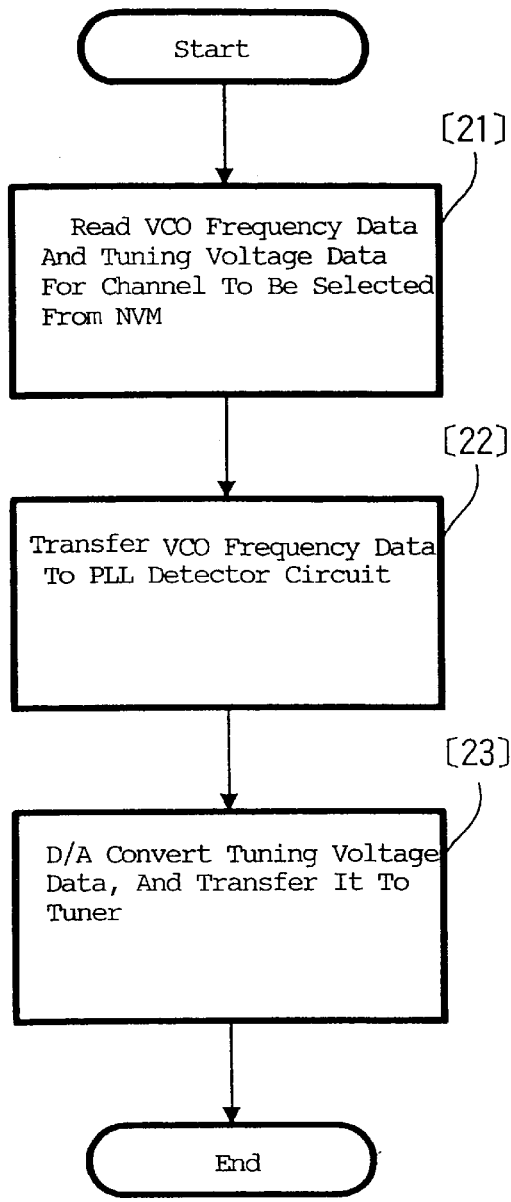

Specifically, when the operation for reception is started in FIG. 4B, data on a frequency of the variable frequency oscillator (VCO) 62 for a channel to be selected, and data on a tuning voltage supplied to the local oscillator 3 of the tuner 2 are first read out from the non-volatile memory (NVM) 17 at step [21].

Next, at step [22], the read data on the frequency is transferred to the variable frequency oscillator (VCO) 62 of the PLL detector circuit 6. Further, at step [23], the read data on the tuning voltage is transferred to the local oscillator 3 of the tuner 2. Thus, the reception is started, while the foregoing operation for reception is terminated, and a normal operation is subsequently performed. This operation for reception is executed each time a channel is selected.

Thus, according to the foregoing television receiving apparatus, a television receiving apparatus having a tuner for converting a received signal to an intermediate frequency signal and supplying the intermediate frequency signal to a homodyne detector circuit through a filter means to extract a video signal, is provided with variable frequency oscillating means for changing the frequency of the intermediate frequency signal such that the frequency of beat components between a local oscillating signal of the tuner and a harmonic signal of the intermediate frequency signal is coincident with a trap frequency of the filter means, thereby making it possible to reliably prevent the occurrence of interference by a simple configuration.

In the foregoing apparatus, while the frequency of an audio intermediate frequency signal is also shifted by +Δf, this frequency Δf is merely about 0.25 MHz, as previously mentioned, so that no problem will be caused thereby in detection and demodulation of the audio signal.

Also, in the foregoing apparatus, when the frequencies of intermediate frequency signals for all the channels are shifted by +Δf, channels other than the aforementioned Channel 5 may be adversely affected thereby. In addition, according to the foregoing apparatus, it is also possible to optimize the frequency of the intermediate frequency signal for each channel to be received.

Further, while the foregoing embodiment has been described in line with the channel plan for Japanese television broadcasting, the present invention may be applied likewise to channel plans or standard schemes for broadcasting in other countries by determining respective frequencies required thereby. Also, it goes without saying that a variety of modifications may be made without departing largely from the spirit of the present invention.

| LIST OF REFERENCE NUMERALS AND ITEMS | |
|---|---|
| Reference Numeral | Item |
| 1 | Antenna |
| 2 | Tuner |
| 3 | Local Oscillator |
| 4 | Surface Acoustic Wave (SAW) Filter |
| 5 | Intermediate Frequency Amplifier (VIF) Circuit |
| 6 | PLL Detector Circuit |
| 61 | Homodyne Detector Circuit |
| 62 | Variable Frequency Oscillator (VCO) |
| 63 | Phase Detector (φ) |
| 7 | Video Demodulator Circuit |
| 8 | RGB Processing Circuit |
| 9 | Color Cathode Ray Tube (CRT) |
| 10 | Audio Detctor Circuit |
| 11 | Audio Processing Circuit |
| 12 | Speaker |
| 13 | AFT Circuit |
| 14 | Microcomputer for System Control |
| 15 | Key Matric Unit |
| 16 | Remote Control Unit |
| 17 | Non-Volatile Memory (NVM) |

What is claimed is:

1. A television receiving apparatus comprising:

a tuner for converting a received signal to an intermediate frequency signal;

filter means for receiving said intermediate frequency signal and for supplying a filtered intermediate frequency signal to a homodyne detector circuit, wherein said homodyne detector circuit detects and outputs a video signal;

variable frequency oscillating means for shifting a frequency of said intermediate frequency signal such that a harmonic signal of said intermediate frequency signal induced into said tuner is coincident with a trap frequency of said filter means after said harmonic signal is converted by said tuner, wherein an output of said variable frequency oscillating means is fed to said homodyne detector circuit; and intermediate frequency signal control means for controlling said variable frequency oscillating means for changing the frequency of said intermediate frequency signal at every selected channel, wherein said tuner includes frequency converting means for converting said received signal into said intermediate frequency signal such that a frequency of a detecting signal of said homodyne detector circuit is coincident with the frequency of said intermediate frequency signal, and the frequency of the detecting signal of said homodyne detector circuit is changed by said variable frequency oscillating means so that the frequency of said intermediate frequency signal is made coincident with the frequency of the detecting signal of said homodyne detector circuit.

2. A television receiving apparatus comprising:

a tuner for converting a received signal to an intermediate frequency signal;

filter means for receiving said intermediate frequency signal and for supplying a filtered intermediate frequency signal to a homodyne detector circuit, wherein said homodyne detector circuit detects and outputs a video signal;

variable frequency oscillating means for shifting a frequency of said intermediate frequency signal such that a harmonic signal of said intermediate frequency signal induced into said tuner is coincident with a trap frequency of said filter means after said harmonic signal is converted by said tuner, wherein an output of said variable frequency oscillating means is fed to said homodyne detector circuit; and intermediate frequency signal control means for controlling said variable frequency oscillating means for changing the frequency of said intermediate frequency signal at every selected channel, wherein said filter means comprises a surface acoustic wave filter.

* * * * *